(12) United States Patent
Taki

(10) Patent No.: US 8,618,852 B2
(45) Date of Patent: Dec. 31, 2013

(54) SEMICONDUCTOR INTEGRATED CIRCUIT

(71) Applicant: Renesas Electronics Corporation, Kawasaki (JP)

(72) Inventor: Yoshitaka Taki, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/783,294

(22) Filed: Mar. 2, 2013

(65) Prior Publication Data

US 2013/0249609 A1    Sep. 26, 2013

(30) Foreign Application Priority Data

Mar. 26, 2012 (JP) ................................. 2012-069033

(51) Int. Cl.
*H03L 7/06* (2006.01)
(52) U.S. Cl.
USPC .......................................... 327/156; 327/147
(58) Field of Classification Search
USPC ................................................. 327/147, 156
See application file for complete search history.

(56) References Cited

U.S. PATENT DOCUMENTS

| | | | |
|---|---|---|---|
| 6,160,861 A * | 12/2000 | McCollough | 375/376 |
| 6,229,400 B1 * | 5/2001 | McCollough et al. | 331/17 |
| 7,620,094 B2 * | 11/2009 | Yoneda | 375/130 |
| 7,729,418 B2 | 6/2010 | Watabe | |
| 2006/0056491 A1 * | 3/2006 | Lim et al. | 375/130 |
| 2006/0056561 A1 * | 3/2006 | Zhang | 375/376 |
| 2006/0268971 A1 * | 11/2006 | Watabe | 375/226 |
| 2007/0019711 A1 * | 1/2007 | Mallinson et al. | 375/130 |
| 2009/0102526 A1 * | 4/2009 | Yoneda | 327/158 |
| 2011/0026083 A1 * | 2/2011 | Nakazawa | 358/401 |
| 2011/0285439 A1 * | 11/2011 | Xiu | 327/159 |
| 2012/0076176 A1 * | 3/2012 | Gelhausen et al. | 375/146 |

FOREIGN PATENT DOCUMENTS

| | | |
|---|---|---|
| JP | 2006-333119 A | 12/2006 |
| JP | 2007-078617 A | 3/2007 |

* cited by examiner

*Primary Examiner* — Adam Houston
(74) *Attorney, Agent, or Firm* — Miles & Stockbridge P.C.

(57) ABSTRACT

An SSCG generating a center-spread modulated clock centering on a frequency obtained by multiplying an input reference clock frequency by a predetermined number is configured to include a phase comparator, a VCO, and a modulation circuit formed by a frequency divider and a division ratio modulation circuit. The division ratio modulation circuit supplies the frequency divider with a division ratio modulated above and below the predetermined multiplication number, and outputs a magnitude relationship involved as a spread direction identification signal. The diagnostic circuit includes a counter that counts the modulated clock and, based on the spread direction identification signal, performs counting operations during an up-spread or down-spread period. Based on the values counted for a predetermined period, the operating status of the SSCG is diagnosed for the presence or absence of a failure, for example.

14 Claims, 9 Drawing Sheets

SEMICONDUCTOR INTEGRATED CIRCUIT

CROSS-REFERENCE TO RELATED APPLICATIONS

The disclosure of Japanese Patent Application No 2012-069033 filed on Mar. 26, 2012 including the specification, drawings and abstract is incorporated herein by reference in its entirety.

BACKGROUND

The present invention relates generally to a semiconductor integrated circuit having a spread spectrum clock generator (SSCG) and particularly to the self-diagnosis of the same semiconductor integrated circuit.

The SSCG is a clock generator that modulates a clock frequency in a manner varying over time. The SSCG is mounted mostly over digital LSI's as a clock generator for suppressing unnecessary electromagnetic radiation from the semiconductor integrated circuit. Generally, the SSCG is configured by adding a modulation circuit to a PLL circuit to which a reference clock is input and which multiples the frequency. There are two types of spread modulation, center-spread modulation and down-spread modulation, relative to a center frequency obtained by suitably multiplying the reference clock frequency. Center-spread modulation involves modulating the frequency symmetrically above and below the center frequency. Down-spread modulation involves modulating the frequency only on the low-frequency side, with the highest frequency established by suitably multiplying the reference clock frequency.

Meanwhile, the self-diagnostic function for semiconductor integrated circuits is important because their test cost is on the increase as a result of their ever-increasing degrees of integration. In particular, it is very important for the SSCG to possess a self-diagnostic function that may replace otherwise-necessary special equipment such as a spectrum analyzer of which the measuring time tends to be prolonged.

Japanese Unexamined Patent Publication No. 2006-333119 (called Patent Literature 1 hereunder) discloses a circuit technique for testing a clock generation circuit acting as an SSCG. The disclosed technique involves measuring the center frequency for down-spread modulation and comparing the measured frequency with a standard value to diagnose whether the clock generation circuit is normal or defective.

The structure described in paragraphs [0023] through [0025] and in FIG. 1 of the above-cited Patent Literature 1 is as follows: The structure includes an SSCG 2 and a test circuit 1 for use therewith. The SSCG 2 uses a modulated wave signal to modulate a VCO control voltage of a frequency multiplication circuit utilizing an ordinary PLL. In the PLL, a phase comparator detects the phase difference between a reference input signal and a feedback signal obtained by dividing the clock output from a VCO using a frequency divider. The output of the phase comparator is input to a control voltage terminal of the VCO via a charge pump circuit and a low-pass filter. When modulation is not performed, the SSCG outputs the clock of a multiplied frequency stemming from multiplication of the frequency of the reference input signal. The multiplication count is given by the division count of the frequency divider. When modulation is performed, the SSCG outputs a clock of which the frequency fluctuates up and down based on the modulated wave signal in reference to the multiplied frequency. The modulated wave signal is a low-frequency signal such as a triangular wave signal or a sing wave signal that gives the clock frequency of the SSCG a fluctuation cycle and a fluctuation range. The test circuit generates a digital signal indicative of one cycle of the modulated wave by binarizing the modulated wave signal with a comparator and, using the generated digital signal, gets a counter to count the clock of one cycle of the modulated wave. A comparator compares the measured count value with a maximum and a minimum value of the count value of one cycle of the modulated wave, thereby determining whether the clock frequency falls between the upper and the lower limits thereof.

Japanese Unexamined Patent Publication No. 2007-78617 (called Patent Literature 2 hereunder) discloses a circuit technique for testing the SSCG mounted over a semiconductor chip such as ASIC. The structure described in paragraphs [0016] through [0027] and in FIG. 1 of Patent Literature 2 is as follows: A counter A is provided to count an unmodulated clock, and a counter B is provided to count the modulated clock. The counting operations of the counters A and B are started simultaneously by writing a reset instruction value to a reset register. Thereafter, a comparator is used to compare the value of the counter A with that of the counter B. When the value of the counter A reaches a predetermined count value set for the register A, the comparator outputs a stop signal to stop the counting operation of the counter B. After the counting operation of the counter B is stopped by the stop signal, the value of the counter B is placed into the register B when the modulation function is on or into a register C when the modulation function is off. In other words, a series of actions comprised of a reset, a counting operation, and a count result transfer is carried out twice, i.e., when the modulation function is on and when the modulation function is off. Thereafter, the value of the register B and that of the register C are compared, and the result of the comparison is output. In the case of down-spread modulation, the SSCG is diagnosed to be normal if the comparator detects that the value of the register B is smaller than the value of the register C.

In the case of center-spread modulation, even if the clock is normally modulated, the value of the register B becomes equal to that of the register C in the above outlined circuit because the clock frequency is spread in vertically symmetrical fashion about the center frequency in effect when modulation is off. Whether the modulation operation is normally active or is switched off, the value of the register B is equal to that of the register C. This means that the above circuit is incapable of diagnosing whether the SSCG is normal or defective. Thus as described in FIG. 3 and in paragraphs [0033] through [0043] of Patent Literature 2, the bottleneck above is bypassed using a test mode signal that measures the modulation operation for a half-cycle. The test mode signal causes the counter B to count the modulation operation for a half-cycle, and the clock count value on the positive or negative modulation side is stored into the register B. On the other hand, with the modulation operation switched off, the count value for one cycle is placed into the register C. The comparator compares half of the value of the register C with the value of the register B so as to diagnose whether the SSCG is normal. The SSCG is diagnosed to be normal both when the value of the register B is larger than half of the value of the register C in a half-cycle on the positive modulation side and when the value of the register B is smaller than half of the value of the register C in a half-cycle on the negative modulation side.

SUMMARY

The circuit technique described in Patent Literature 1 fully implements the diagnostic function when down-spread modulation is in effect but cannot provide accurate diagnosis in the case of center-spread modulation, as pointed out by Patent Literature 2.

Although Patent Literature 2 indicates that the bottleneck of the inaccurate diagnosis above is circumvented by counting the modulation operation only for half a cycle, it does not disclose the method of generating control signals for counting the modulation operation for a half-cycle. If the modulated wave signal is a signal that is inverted precisely in a half-cycle such as the sine wave, getting the comparator to binarize the modulated wave signal will generate a signal with a 50-percent duty ratio, i.e., an accurate half-cycle signal, However, tests can limit the waveform of the modulated wave signal.

Furthermore, the modulated wave signal is an analog signal that modulates a control voltage signal. When superimposed with noise, the modulated wave signal causes fluctuation of the frequency of the clock output by the SSCG. This means that operating a test circuit for test purposes can superimpose the noise generated by the test circuit onto the modulated wave signal, the superimposed noise possibly causing the fluctuation of the frequency of the clock output by the SSCG. This is a serious problem because the characteristics of a test object may be varied due to the test circuit.

The present invention has been made in view of the above circumstances and provides an innovative semiconductor integrated circuit.

In carrying out the present invention and according to one embodiment thereof, there is provided an SSCG that generates a modulated clock of which the frequency is modulated above and below a center frequency obtained by multiplying the frequency of an input reference clock by a predetermined multiplication count. The SSCG includes a phase comparator comparing the phase of the reference clock with that of a feedback clock, an oscillator outputting the modulated clock of which the oscillating frequency is controlled based on output from the phase comparator, and a modulation circuit receiving input of the modulated clock so as to output the feedback clock. The modulation circuit includes a frequency divider and a division ratio modulation circuit supplying a division ratio to the frequency divider, and outputs the feedback clock by dividing the output of the oscillator by the division ratio. The division ratio modulation circuit modulates the division ratio so that the ratio fluctuates over time above and below the predetermined multiplication count, while outputting a magnitude relationship between the division ratio and the multiplication count in the form of a spread direction identification signal.

The diagnostic circuit of the SSCG includes a counter A counting the reference clock and a counter B counting the modulated clock. Based on the spread direction identification signal, the diagnostic circuit controls the count operation of one or both of the counters A and B. The diagnostic circuit diagnoses operating status of the SSCG (e.g., presence or absence of defects) based on one or both of the values of the counters A and B.

The major benefits of the above-outlined embodiment of this invention are as follows:

In a center-spread. SSCG, it is possible precisely to diagnose operating status on the up-spread and the down spread sides while minimizing the effects of the noise generated by the diagnostic circuit on the clock frequency output by the SSCG.

BRIEF DESCRIPTION OF THE DRAWINGS

Further objects and advantages of the present invention will become apparent upon a reading of the following description and appended drawings in which.

DETAILED DESCRIPTION

1. Outline of the Embodiments

Figure 1:
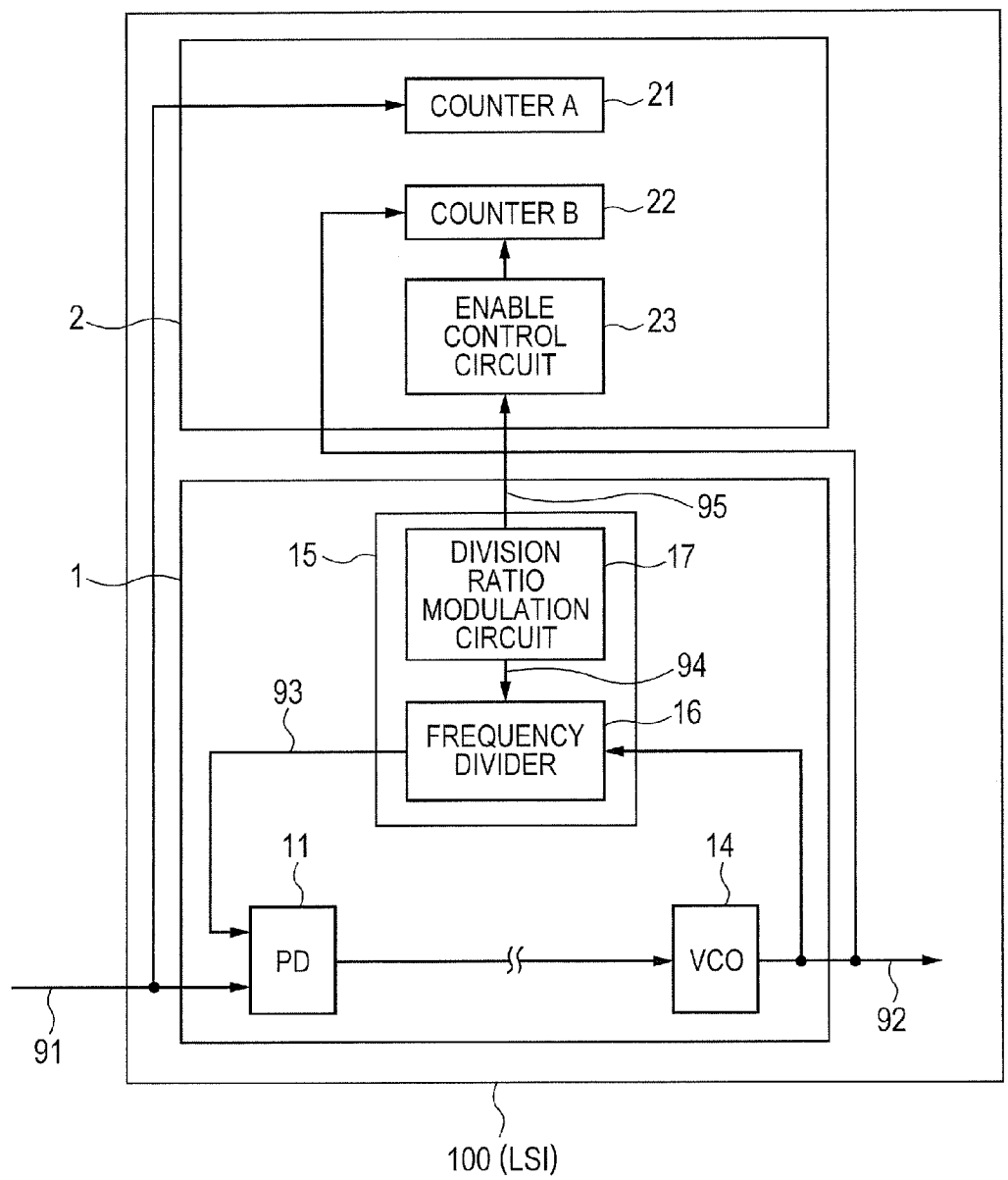
FIG. 1 is a block diagram outlining an LSI including a clock generator and a diagnostic circuit in a first embodiment of the present invention.

Representative embodiments of the present invention disclosed in this specification are outlined below. The reference numerals parenthesized in the ensuing description of the embodiments and found in the accompanying drawings designate merely what is included in the concepts of the components indicated by the numerals.

[1]<SSCG Diagnostic Circuit Furnished with the Division Ratio Modulation Circuit Outputting the Spread Direction Identification Signal>

A semiconductor integrated circuit (100) is provided including a clock generator (1) receiving input of a reference clock (91) so as to generate a modulated clock (92) based on the reference clock (91), and a diagnostic circuit (2). The semiconductor integrated circuit (100) is configured as follows:

The clock generator (1) includes a phase comparator (11) that compares the phase of the reference clock (91) with that of a feedback clock (93), an oscillator (14) that outputs the modulated clock of which the oscillating frequency is controlled based on output from the phase comparator (11), and a modulation circuit (15) that receives input of the modulated clock so as to output the feedback clock (93). The modulation circuit (15) includes a frequency divider (16) and a division ratio modulation circuit (17) that feeds a division ratio (94) to the frequency divider (16). The frequency divider (16) outputs the feedback clock (93) by dividing the output of the oscillator (14) by the division ratio (94). The division ratio modulation circuit (17) is fed with a multiplication count, and has at least one of two periods. One of the two periods is one in which the division ratio modulation circuit (17) outputs a value larger than the multiplication count; the other period is one in which the division ratio modulation circuit (17) outputs a value smaller than the multiplication count. The division ratio modulation circuit (17) outputs a magnitude relationship between the division ratio (94) and the multiplication count in the form of a spread direction identification signal (95).

The diagnostic circuit (2) includes a first counter (21) that counts the reference clock (91), and a second counter (22) that counts the modulated clock (92) based on the spread direction identification signal (95).

With a center-spread SSCG of the above-described structure, it is possible accurately to diagnose operating status on the up-spread and the down-spread sides while minimizing the effects of the noise generated by the diagnostic circuit (2) on the clock frequency output by the SSCG.

[2]<Bus Interface Plus the Bus Plus the CPU>

In the structure described in the subsection [1] above, a CPU (3) and bus (4) may be be further provided. The diagnostic circuit (2) may further include a modulation mode designation register (25) and a bus interface circuit (24). The bus interface circuit (24) couples the first counter (21) and second counter (22) to the bus (4) in a manner accessible from the CPU (3). When the spread direction identification signal (95) indicates the direction of spread designated by the modulation mode designation register (25), the second counter (22) is caused to perform a count operation. The CPU (3) diagnoses operating status of the clock generator (1) based on at least one of the values of the first and the second counters (21) and (22).

With the above structure, it is possible to perform complicated diagnosis while minimizing the size of the diagnostic circuit (2).

[3]<Control of the Measuring Period by Use of the Enable Register>

In the structure described in the subsection [1] or [2] above, the diagnostic circuit (2) may further include an enable register (27) coupled to the bus interface circuit (24) in a manner writable from the CPU (3) via the bus (4). During the period in which the enable register (27) has a value for inhibiting a count operation, the first and the second counters (21) and (22) are inhibited from performing their count operations.

With the above structure, it is possible for the CPU (3) directly to manage the counting period (measuring period) of the counters, which shorten test time.

[4]<Control of the Measuring Period by Use of the Reference Clock-Side Counter>

In the structure described in the subsection [1] or [2] above, the first counter (21) may be a down-counter to which an initial value can be written by the CPU (3) via the bus (4). During the period in which the first counter (21) has a positive value, the second counter (22) is allowed to perform a count operation.

With the above structure, there is no need for the CPU (3) directly to manage the counting period (measuring period) of the counters. This raises the degree of freedom in establishing the timing for reading count results, thereby shortening test time.

[5]<Control of the Measuring Period by Use of the Modulated Clock-Side Counter>

In the structure described in the subsection [1] or [2] above, the second counter (22) may be a down-counter to which an initial value can be written by the CPU (3) via the bus (4). During the period in which the second counter (22) has a positive value, the first counter (21) is allowed to perform a count operation.

With the above structure, there also is no need for the CPU (3) directly to manage the counting period (measuring period) of the counters. This raises the degree of freedom in establishing the timing for reading count results and thereby shortens test time.

[6]<Interrupt>

In the structure described in the subsection [4] above, the diagnostic circuit (2) may generate an interrupt (98) to the CPU (3) when the Value of the first counter (21) becomes zero.

With the above structure, it is possible for the CPU (3) to know the timing for completion of the counting. This allows the CPU (3) to effectively utilize the time until the count result is to be read out, thereby shortening test time

[7]<Diagnosis Over a Predetermined Range of Values>

In the structure described in any one of the subsections [1] through [6] above, the CPU (3) may diagnose whether the clock generator (1) is defective by reading at least one of the values of the first and the second counters (21) and (22) and by comparing what is read with a predetermined range of values.

The structure above allows diagnosis to be carried out in a more quantitative manner than before.

[8]<Method for Modulating the Division Ratio>

In the structure described in any one of the subsections [1] through [7] above, the division ratio modulation circuit (17) may be further given a modulation degree. The division ratio modulation circuit (17) may increase gradually the division ratio (94) up to a maximum division ratio calculated on the basis of the multiplication count and modulation degree. The division ratio modulation circuit (17) may also decrease gradually the division ratio (94) down to a minimum division ratio calculated on the basis of the multiplication count and modulation degree.

The structure above provides modulated waveforms as desired.

[9] <Counting of the Modulated Clock Based on the Spread Status Signal>

There is also provided a semiconductor integrated circuit (100) including a clock generator (1) that receives input of a reference clock (91) so as to generate a modulated clock (92) based on the input reference clock (91), and a diagnostic circuit (2). The semiconductor integrated circuit (100) is configured as follows:

The clock generator (1) includes a phase comparator (11) that compares the phase of the reference clock (91) with that of a feedback clock (93), an oscillator (14) outputting the modulated clock (92) of which the oscillating frequency is controlled based on output from the phase comparator (11), and a modulation circuit (15) that receives input of the modulated clock (92) so as to output the feedback clock (93). The modulation circuit (15) includes a frequency divider (16) and a division ratio modulation circuit (17) that feeds a division ratio (94) to the frequency divider (16). The frequency divider (16) outputs the feedback clock (93) by dividing the output of the oscillator (14) by the division ratio (94). The division ratio modulation circuit (17) outputs a spread status signal (95) indicative of modulating status. The diagnostic circuit (2) includes a counter (22) that counts the modulated clock (92) based on the spread status signal (95).

With the above structure, it is possible for the center-spread SSCG accurately to diagnose operating status on the up-spread and the down-spread sides while minimizing the effects of the noise generated by the diagnostic circuit (2) on the clock frequency output by the SSCG.

[10]<Counting on the Up-Spread or Down-Spread Side>

In the structure described in the subsection [9] above, the division ratio modulation circuit (17) may be given a multiplication count and may have at least one of two periods. One of the two periods is one in which the division ratio modulation circuit (17) outputs a value larger than the multiplication count; the other period is one in which the division ratio modulation, circuit (17) outputs a value smaller than the multiplication count. The division ratio modulation circuit (17) outputs a magnitude relationship between the division ratio (94) and the multiplication count in the form of the spread status signal (95). The diagnostic circuit (2) causes the counter (22) to count the modulated clock when the division ratio (94) is either larger or smaller than the multiplication count based on the spread status signal (95).

With the above structure, it is also possible for the center-spread SSCG accurately to diagnose operating status on the up-spread and the down-spread sides while minimizing the effects of the noise generated by the diagnostic circuit (2) on the clock frequency output by the SSCG.

[11]<Method for Modulating the Division Ratio>

In the structure described in the subsection [10] above, the division ratio modulation circuit (17) may be further given a modulation degree. The division ratio modulation circuit (17) may increase gradually the division ratio (94) up to a maximum division ratio calculated on the basis of the multiplication count and modulation degree. The division ratio modulation circuit (17) may also decrease gradually the division ratio (94) down to a minimum division ratio calculated on the basis of the multiplication count and modulation degree.

The structure above also provides modulated waveforms as desired.

[12] <Reference Clock Counter>

In the structure described in the subsection [9], [10] or [11] above, the counter may be regarded as a second counter (22). The diagnostic circuit (2) may further include a first counter (21) that counts the reference clock (91). After causing the first and the second counters (21) and (22) to perform count operations for the same period, the diagnostic circuit (2) may diagnose whether the clock generator (1) is defective based on the count values of the first and the second counters (21) and (22).

With the above structure, accurate diagnosis is made possible through the use of the frequency of the reference clock not subject to SSCG modulation.

[13]<Control of the Measuring Period by Use of the Reference Clock-Side Counter>

In the structure described in the subsection [9], [10] or [11] above, the counter may be regarded as the second counter (22). The diagnostic circuit (2) may further include the first counter (21) to which a first positive initial value is set and which down-counts in accordance with the reference clock (91). During the period in which the first counter has a positive count value, the diagnostic circuit (2) causes the second counter to perform a count operation. Thereafter, the diagnostic circuit (2) diagnoses whether the clock generator (1) is defective based on the count value of the count counter (22).

With the above structure, it is possible to control the counting period (measuring period) of the modulated clock using the reference clock not subject to SSCG modulation, whereby accurate diagnosis is made possible.

[14]<Control of the Measuring Period by Use of the Modulated Clock-Side Counter>

In the structure described in the subsection [9], [10] or [11] above, the counter may be regarded as the second counter (22). The diagnostic circuit (2) may further include the first counter (21) that counts the reference clock (91). The second counter (22) is a counter to which a second positive initial value is set and which down-counts in accordance with the modulated clock (91). During the period in which the second counter (22) has a positive count value, the diagnostic circuit (2) causes the first counter (21) to perform a count operation. Thereafter, the diagnostic circuit (2) diagnoses whether the clock generator (1) is defective based on the count value of the first counter (21).

With the above structure, it is possible to control the counting period (measuring period) of the modulated clock using the modulated clock not subject to SSCG modulation. This makes it easier to provide synchronization with the diagnostic circuit operating on the modulated clock.

2. Details of the Embodiments

The preferred embodiments are described below in more detail.

First Embodiment

FIG. 1 is a block diagram outlining an LSI furnished with a clock generator and a diagnostic circuit in the first embodiment of this invention.

The clock generator implements spread spectrum by modulating the division ratio of a frequency divider in a clock frequency multiplication circuit that uses a PLL. A phase difference detected between a reference clock 91 and a feedback clock 93 by a phase comparator 11 is used as the basis for controlling the oscillating frequency of an oscillator 14. The output of the oscillator 14 is divided by a frequency divider 16 to form the feedback clock 93 that is fed back to the phase comparator 11. The clock frequency output by the oscillator 14 is a frequency obtained by multiplying the frequency of the reference clock 91 by the division ratio, so that the clock generator 1 functions as a clock frequency multiplication circuit. In this embodiment, the division ratio 94 supplied from a division ratio modulation circuit 17 of a modulation circuit 15 to the frequency divider 16 is modulated above and below a predetermined multiplication count. In this context, the modulation of the division ratio means outputting as the division ratio 94 the value obtained by having the division ratio 94 modulated over time in the positive and negative directions about a predetermined multiplication count based on a predetermined modulation degree and modulation frequency. At the same time, the division ratio modulation circuit 17 generates and outputs a spread direction identification signal 95 depending on whether the division ratio 94 to be output is larger or smaller than the predetermined multiplication count. Details of these operations will be discussed later.

Although FIG. 1 shows a clock frequency multiplication circuit that uses a PLL as the typical clock generator 1, the clock generator 1 may also be something else as long as it can output a clock obtained by modulating the frequency of the reference cock using a digital signal. As such the clock generator 1 may be a digital PLL, a clock frequency divider, or a clock frequency multiplier. The phase comparator 11 may be replaced with a frequency comparator. Although FIG. 1 shows the oscillator 14 in the form of a voltage-controlled oscillator (VCO), the oscillator 14 may be replaced with an oscillator controlled by currents, digital values, or some other control signal. The loop of the PLL is formed by interposing, say, a charge pump circuit and a low-pass filter between the phase comparator 11 and the oscillator 14.

The diagnostic circuit 2 includes a counter A21 that counts the reference clock, a counter B22 that counts a modulated clock 92, and an enable control circuit 23. The enable control circuit 23 controls whether or not to get the counter E22 to perform its count operation based on the spread direction identification signal 95 output from the division ratio modulation circuit 17.

Figure 2:
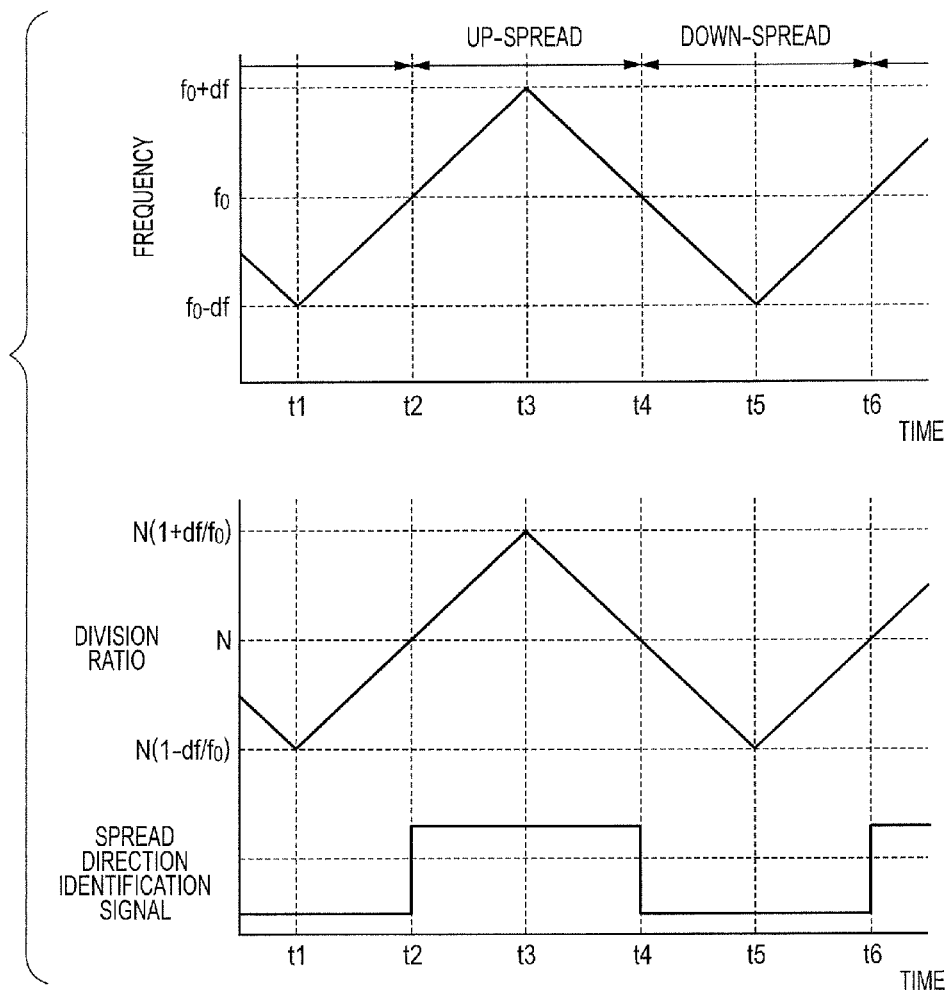
FIG. 2 is a timing chart showing typical operations of the clock generator and a division ratio modulation circuit in the first embodiment.

FIG. 2 is a timing chart showing typical operations of the clock generator and division ratio modulation circuit in the first embodiment. The clock generator 1 operates as a center-spread SSCG. The clock generator 1 outputs the modulated clock 92 obtained by modulating a frequency df over time in the positive and negative directions about a frequency $f_0$ acquired by multiplying the frequency of the reference clock 91 by a multiplication count N. As shown in the upper part of FIG. 2, the frequency of the modulated clock 92 bottoms out at time t1 and time t5 (the lowest frequency $f_0$–df) and peaks at time t3 (the highest frequency $f_0$+df). The period from time t2 to time t4 where the frequency of the modulated clock 92 is higher than $f_0$ is an up-spread period, and the period from time t4 to time t6 where the frequency of the modulated clock 92 is lower than $f_0$ is a down-spread period.

In the embodiment shown in FIG. 1, the division ratio modulation circuit 17 in the modulation circuit 15 calculates the division ratio 94 to be fed to the frequency divider 16. The division ratio 94 is raised and lowered within a range of $N(1-df/f_0)$ through $N(1+df/f_0)$ above and below a predetermined multiplication count N so that the frequency of the modulated clock 92 may be modulated as shown in FIG. 2. The division ratio modulation circuit 17 outputs the division ratio 94 in a manner that the ratio 94 reaches $N(1-df/f_0)$ at time t1, increases gradually to reach N at time t2, increases further to reach $N(1+df/f_0)$ at time t3, drops from there to $N(1-df/f_0)$ at time t5, before rising again, and so on.

Specifically, the frequency divider may be configured using known technology so that the division ratio is given as M/L where L and M are an integer each. Whereas FIG. 2 shows the division ratio to increase in a smooth, linear manner, the division ratio may also be varied in stepped fashion when the integer L and N are suitably raised and lowered. If the integers L and N are a sufficiently large number each, the steps are minimized and may approximate a straight line.

Although FIG. 2 shows a typical SSCG that modulates the frequency of the modulated clock 92 in the form of a triangular wave, the waveform of the modulated signal is not limited to the triangular wave. Alternatively, the waveform of the modulated signal may be a sine wave, a rectangular wave, a sawtooth wave, or some other suitable waveform desired.

The division ratio modulation circuit 17 generates and outputs the spread direction identification signal 95 in addition to the division ratio 94. During the period from time t2 to time t4 in which the division ratio 95 is larger than the predetermined multiplication count N, the division ratio modulation circuit 17 outputs a high level; during the period from time t4 to time t6 in which the division ratio 95 is smaller than the multiplication count N, the division ratio modulation circuit 17 outputs a low level. The high-level spread direction identification signal 95 indicates that the clock generator 1 is set for up-spread, and the low-level spread direction identification 95 indicates that the clock generator 1 is set for down-spread. As mentioned above, a digital logic circuit may be configured to generate the division ratio 94 in the form of M/L where M and L are an integer each, the logic being designed so that the spread direction identification signal 95 is also generated.

The division ratio modulation circuit 17 is configured to include a circuit that controls the raising and lowering of the integers L and N using a state machine that operates based on the multiplication count N. modulation frequency, modulation degree, and control clock frequency that have been input. To raise the division ratio M/L involves performing control to gradually increase the integer N or gradually decrease the integer L; to lower the division ratio N/L involves performing control to gradually decrease the integer N or gradually increase the integer L. The division ratio M/O may be controlled in more detailed fashion by suitably varying both the integer L and the integer M. Based on the input modulation degree, a maximum and a minimum of the value of the division ratio M/L or that of each of the integers L and N may be calculated in advance. Control may then be performed so that the value in question upon reaching its maximum or minimum value is turned back therefrom while being varied. In this case, the condition for determining a magnitude relationship between the division ratio N/L and the multiplication count L is output in the form of the spread direction identification signal 95 using a comparison circuit or a combination logic circuit as a simplified comparison circuit.

In another example, the division ratio modulation circuit 17 may be configured to include a table that stores the values of the integers L and M calculated for different steps of the control clock. These values may be read from the table in synchronism with the control clock so as to output the division ratio 94 in a manner conforming to the desired modulated waveform. The circuit for raising and lowering the integers L and M is effective when the modulated waveform is a triangular wave, and the use of the table permits output of the desired waveform. This arrangement is thus effective for outputting such modulated waves as sine waves that are complicated and difficult to calculate through arithmetic operations. In such a case, the spread direction identification signal 95 may also be calculated beforehand and stored in the same table.

As described above, the division ratio 94 varies in stepped fashion from a microscopic point of view. This is a characteristic noticeable when the division ratio is modulated not with an analog signal but with a digital signal. That the modulated waveform is not smooth but stepped does not pose problems to the SSCG. That is because the clock spectrum is spread out when the clock frequency of the LSI is varied over time, with the level of radiation power reduced by as much as the amount of the spread.

The diagnostic circuit 2 controls whether or not to cause the counter B22 to perform or stop its count operation based on the spread direction identification signal 95. For example, the average frequency during the up-spread period is obtained by causing the counter B22 to perform its count operation only while the spread direction identification signal 95 is being High; the average frequency during the down-spread period is acquired by causing the counter B22 to carry out its count operation only while the spread direction identification signal 95 is being Low. Because the counter A21 counts the reference clock 91, the count value of the counter A21 multiplied by the multiplication count N is proportional to the center frequency $f_0$ of the SSCG. The values counted by the counters A21 and B22 during the same up-spread period may be used to calculate the modulation degree $df/f_0$. If the measuring period (accumulated time if counting is done over multiple up-spread periods) is represented by Tm, then the count value of the counter A21 is given as $f_0/N \times Tm$. In the case of the triangular wave, the count value of the counter B22 is given as $(f_0+df/2) \times Tm$. The frequency df is then calculated by doubling the result from (count value of the counter B22)÷(count value of the counter A21×N)–1. Likewise, the frequency df for the down-spread period is calculated by having the count operations carried out only during the down-spread period.

Determining whether the calculated frequency df falls within a predetermined range allows the center-spread SSCG precisely to diagnose operating status of the clock generator 1 on the up-spread and down-spread sides. The diagnostic circuit 2 does not affect the characteristics of the clock generator 1 because the diagnostic circuit 2 merely controls the periods in which to count the clock based on the spread direction identification signal 95 output by the modulation circuit 15. Also, since the frequency divider 16 modulating the clock frequency in the clock generator 1 is composed of a digital circuit, the noise generated by the diagnostic circuit is prevented from affecting the clock frequency output by the SSCG.

The diagnosis that involves reading out the count values to perform the above-described calculations thereon for determination may be carried out by circuits inside the LSI. Alternatively, the count values may be read out of the LSI and fed to an external tester for diagnosis. Since the count values are digital values, they can be used by an ordinary logic tester to diagnose whether the performance of the SSCG is normal; there is no need to utilize special equipment such as a spectrum analyzer.

FIGS. 1 and 2 show the example in which the spread direction identification signal 95 is used to provide counter enable control whereby the frequency is counted in the up-spread or down-spread period of spread operations. The spread direction identification signal 95 may be generated as some other signal representative of spread status and used by the enable control circuit 23 for control of the measuring period using counters, the diagnosis being performed with emphasis on other periods. For example, a signal active from time t1 to time t3 may be used to measure the gradient of a rising frequency.

FIGS. 1 and 2 show the example in which the frequency of the up-spread or down-spread period is Counted. Thus the SSCG may perform its diagnosis consecutively in the up-spread and down-spread periods to eventually carry out the overall diagnosis of the SSCG. Meanwhile, if there is provided a counter that operates on the spread direction identification signal 95 taking a logical value inverse to that which causes the counter B22 to operate, then it is possible for the SSCG to perform diagnosis in the up-spread and down-spread periods in parallel. This arrangement can further shorten test time.

The preferred embodiment above is described below in more detail.

Figure 3:
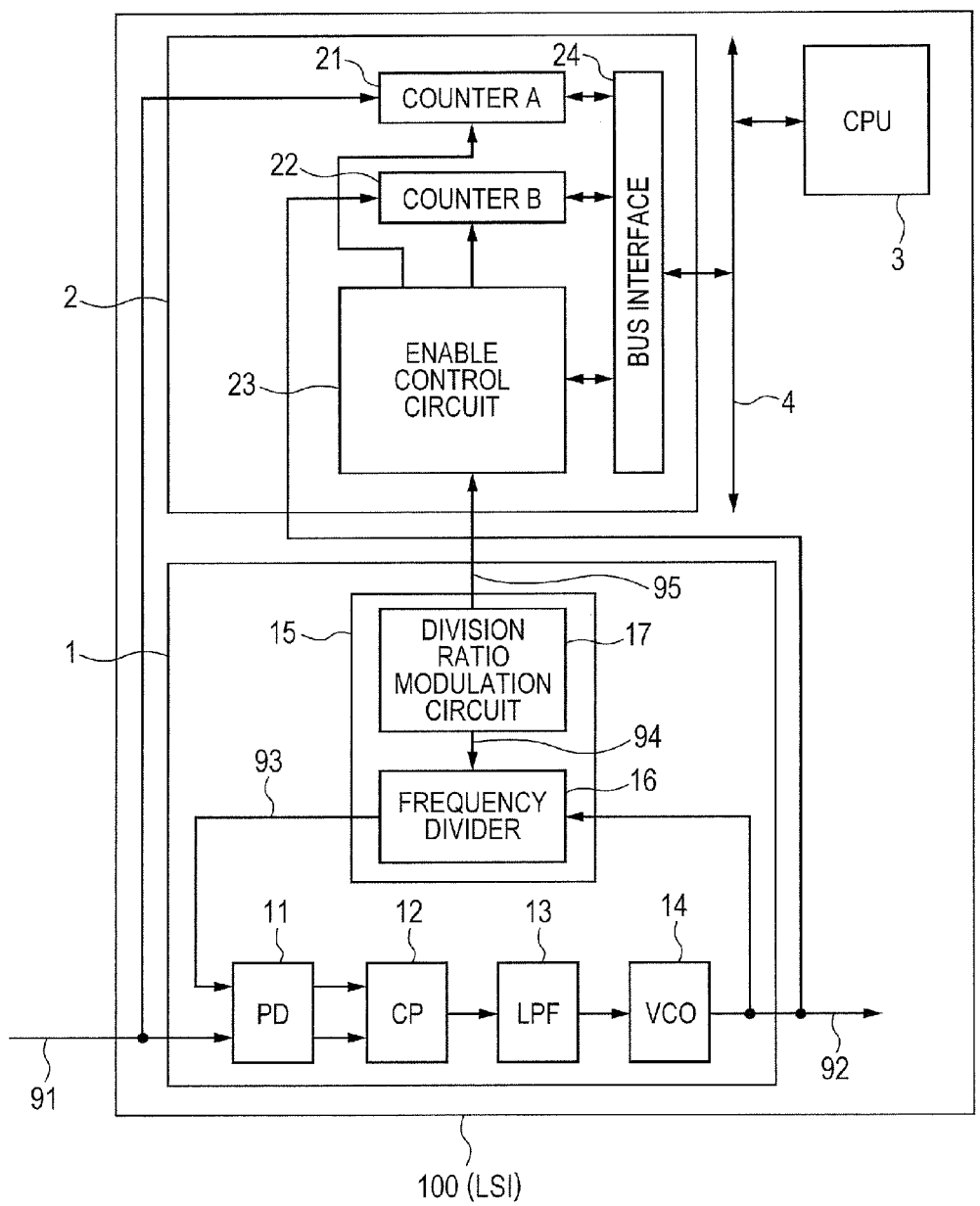
FIG. 3 is a block diagram showing a detailed structure of the LSI including the clock generator and diagnostic circuit in the first embodiment.
Figure 4:
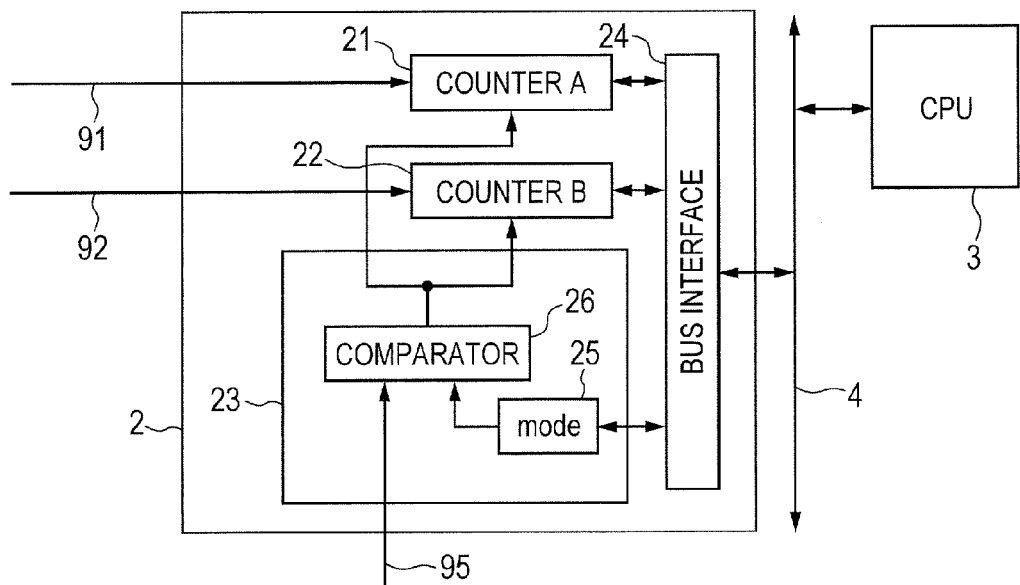
FIG. 4 is a block diagram showing a typical diagnostic circuit in the first embodiment.

FIG. 3 is a block diagram showing a detailed structure of the LSI including the clock generator and diagnostic circuit in the first embodiment. FIG. 4 is a block diagram showing the typical diagnostic circuit in the first embodiment.

The clock generator 1 shown in FIG. 3 is an ordinary analog LSI except that the division ratio modulation circuit 17 is added to the frequency divider 16 therein. A charge pump circuit 12 and a low-pass filter 13 are interposed between the phase comparator 11 and the VCO 14. The phase comparator 11 outputs an UP signal and a DOWN signal for raising and lowering the frequency, respectively. The charge pump 12 is used to charge or discharge a capacitor that forms part of the low-pass filter 13, whereby the control voltage of the VCO 14 is generated. The frequency divider 16 operates in the manner discussed above in reference to FIGS. 1 and 2.

The LSI 100 shown in FIG. 3 has a CPU 3 coupled to a bus 4. For example, the LSI 100 may be an ASIC included in a microcomputer. The diagnostic circuit 2 is furnished with a bus interface 24 coupled to the counter A21 and counter 322, and a register included in the enable control circuit 23 if necessary, in a manner accessible from the CPU 3 via the bus 4.

The typical diagnostic circuit 2 shown in FIG. 4 has the enable control circuit 23 formed by a modulation mode register 25 and a comparator 26. The modulation mode register 25 is coupled to the bus interface 24. Via the bus 4, the CPU 3 may write to the modulation mode register 25 a value designating whether the modulation mode to be diagnosed is up-spread or down-spread. The comparator 26 compares the value written to the modulation mode register 25 with the value of the spread direction identification signal 95. If the compared values match, the counters A21 and B22 are allowed to perform count operations under enable control. Alternatively, the counter A21 may not be subjected to the enable control. Without enable control, the counter A21 takes a count value covering both the up spread and the down-spread periods. Under enable control, the counter A21 takes a count value covering solely the same spread mode as the counter B22, so that diagnosis may be carried out accordingly.

In the clock generator 1, analog circuits are interposed between the phase comparator 11 and the VCO 14, whereas the modulation circuit is the frequency divider 16 composed of digital circuits. That means there is no analog signal propagation path through which the noise generated by the diagnostic circuit 2 may directly affect oscillating operations. In the SSCG described in the above-cited Patent Literature 1, an analog PLL is adopted in which an analog modulation circuit is added downstream of the low-pass filter. Thus the noise generated by the diagnostic circuit can affect oscillation characteristics by way of the modulated signal, as discussed above. By contrast, this embodiment has no such noise propagation path.

The counters A21 and B22 can be accessed by the CPU 3 via the bus 4. The values of these counters can thus be read out by the CU 3 for computations in carrying out the above-described diagnosis. The CPU 3 operates on the modulated clock 92 of which the frequency is, on average, that of the externally input reference clock 91 multiplied by the multiplication count N. That means the CPU 3 can perform diagnosis at higher speeds. Whereas the above-cited Patent Literature 2 discloses a hardware setup including registers and comparison circuits for diagnosis, this embodiment realizes diagnosis by causing the CPU 3 necessary for ordinary LSI operations to run diagnostic software. It follows that the increase in the size of circuitry of the diagnostic circuit is minimized. Also, because the CPU 3 generally possesses functions for executing sophisticated instruction sets and an arithmetic circuit capable of carrying out complicated arithmetic operations, this embodiment can flexibly deal with cases that may require complex operations and judgments for diagnostic purposes.

Furthermore, if the diagnostic program is incorporated in a user program, the diagnosis of the SSCG may be carried out either during tests before shipment or upon installation at a user site after shipment. Diagnosis in such cases is not limited to the one-or-the-other determination of whether the device under test is normal or defective. If deterioration in performance is detected, modulation parameters may be corrected in such a manner that a full-fledged defect is prevented from eventually taking place.

Second Embodiment

Control of the Measuring Period Using the Enable Register

Figure 5:
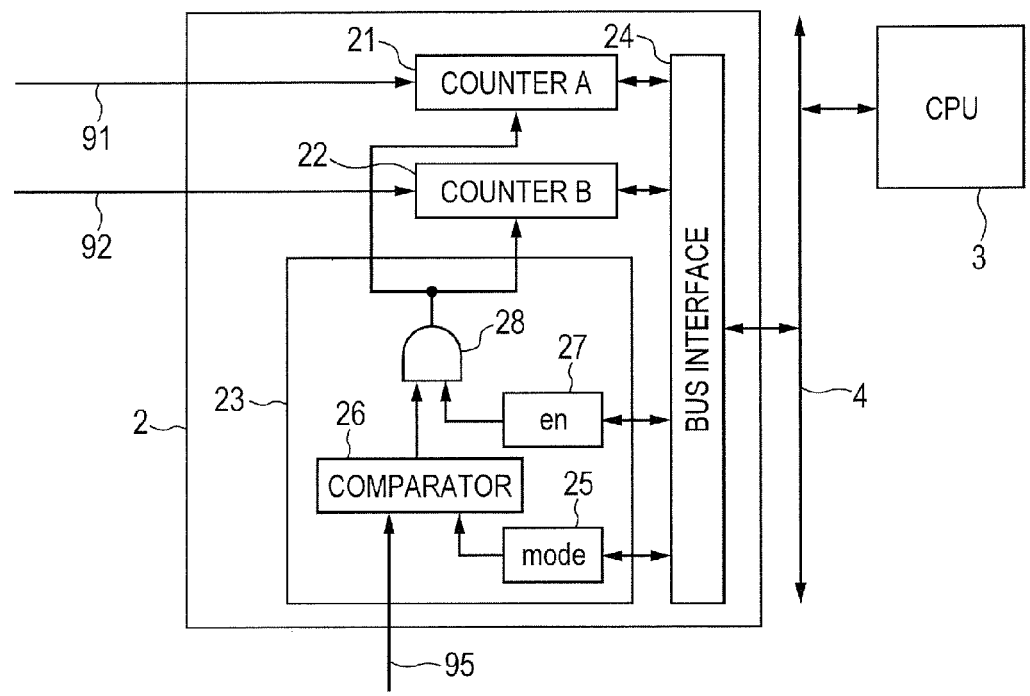
FIG. 5 is a block diagram showing another typical diagnostic circuit in a second embodiment of the present invention.
Figure 6:
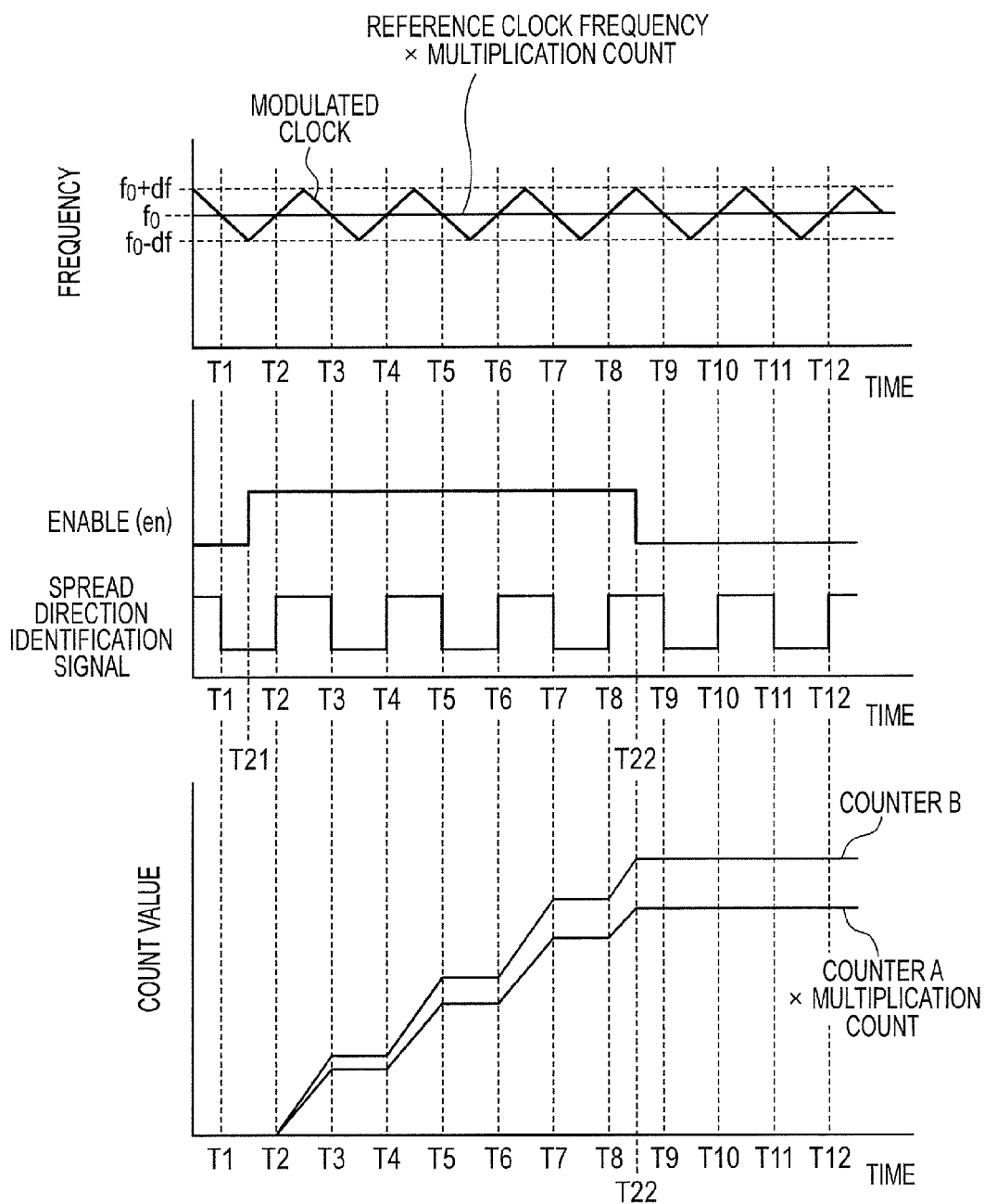
FIG. 6 is a timing chart showing typical operations of a clock generator and the diagnostic circuit in the second embodiment.

FIG. 5 is a block diagram showing another typical diagnostic circuit in the second embodiment of the present invention. FIG. 6 is a timing chart showing typical operations of the clock generator and diagnostic circuit in the second embodiment.

The diagnostic circuit 2 indicated in FIG. 5 is composed of the enable register 27 shown in FIG. 4 supplemented with an enable register 27 and an AND gate 28. The enable register 27 is coupled to the bus interface 24. Via the bus 4, the CPU 3 can write to the enable register 27 a value enabling or disabling the count operations of the counters A21 and B22. Writing "1" to the enable register 27 enables the count operations; writing "0" to the enable register 27 disables the count operations.

How the diagnostic circuit 2 of FIG. 5 operates will now be described in reference to FIG. 6. The upper part of FIG. 6 shows the frequency of the modulated clock 92 for a center-spread SSCG; the middle part shows the value of the enable register 27 and that of the spread direction identification signal 95; the lower part shows the count values of the counters A21 and B22. Since the counter A21 counts the reference clock yet to be multiplied, the count value of the counter A21 in FIG. 6 is shown here as a value resulting from the multiplication by the multiplication count N for easy comparison with the count value of the counter B22.

At time T21 in FIG. 6, the value "1" is written to the enable counter 27. Thus from time T2 at which the spread direction identification signal 95 goes High, the counters A21 and B22 start to count up. Between time T2 and time T3, between T4 and T5, between T6 and T7, and between T8 and T22, i.e., during the periods in high the spread direction identification signal 95 is High, the counters A21 and B22 count up. Between time T3 and time T4, between T5 and T6, and between T7 and T8, i.e., during the periods in which the spread direction identification signal 95 is Low, the counters A21 and B22 stop counting up. That is, only the up-spread period is the counting period (i.e., measuring period). At time T22, the CPU writes the value "0" to the enable register 27. This causes the counters A21 and B22 to stop counting. Because the counting is done only during the up-spread period, the count value of the counter B22 counting the modulated clock 92 becomes larger than the count value of the counter A21 which counts the reference clock and which undergoes multiplication by N. After writing "0" to the enable register 27, the CPU 3 can read via the bus 4 the values of the counters A21 and B22 for diagnosis. Although it is difficult precisely to control when to write values to the enable register 27, the counters A21 and B22 start and stop their counting simultaneously, so that the relative relationship involved is accurate. This allows the CPU 3 precisely to perform diagnosis. Because the values of the counters. A21 and B22 can be read out for diagnosis immediately after the value "0" is written to the enable register 27, there is little time wasted for the diagnostic program of the CPU 3.

With the above arrangement, the CPU can directly manage the counting period (measuring period) of the counters and thereby shorten test time.

Third Embodiment

Control of the Measuring Period by Use of the Reference Clock-Side Counter

The second embodiment described above was an example of controlling the measuring period by use of the enable register. With the second embodiment, as discussed above, it is difficult precisely to control the time at which to write values to the enable register. By contrast, the third embodiment of this invention is arranged to manage precisely the measuring period by use of the counter A21.

Figure 7:
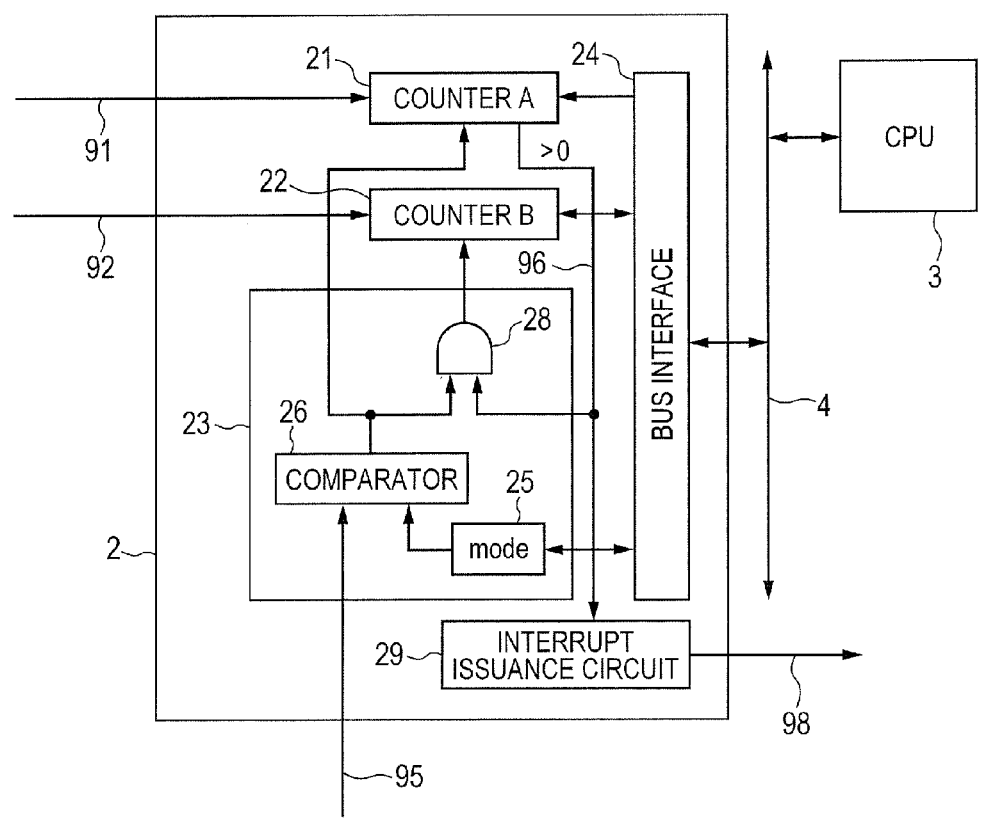
FIG. 7 is a block diagram showing another typical diagnostic circuit in a third embodiment of the present invention.
Figure 8:
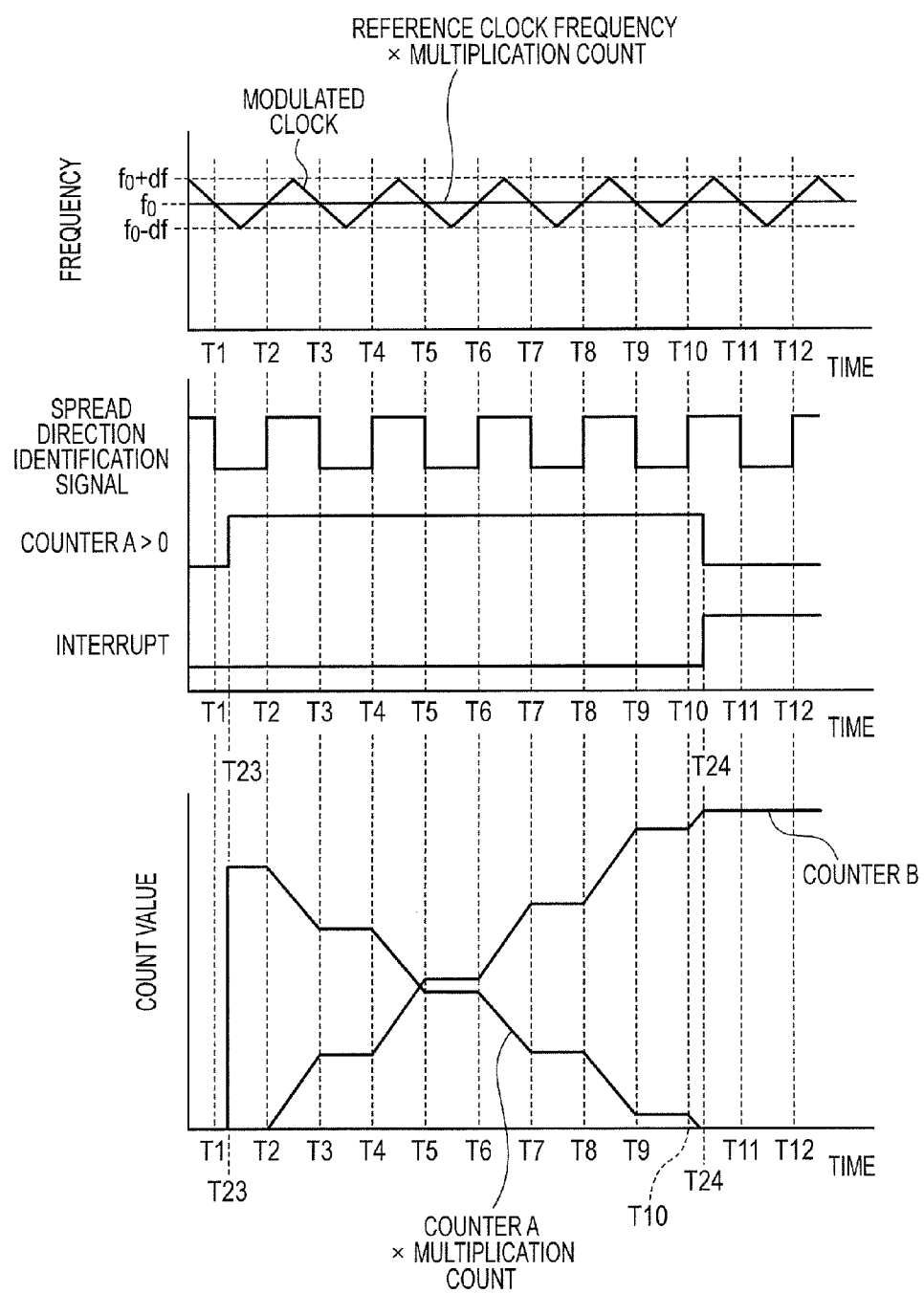
FIG. 8 is a timing chart showing typical operations of a clock generator and the diagnostic circuit in the third embodiment.

FIG. 7 is a block diagram showing another typical diagnostic circuit in the third embodiment of the present invention. FIG. 8 is a timing chart showing typical operations of the clock generator and diagnostic circuit in the third embodiment.

The counter A21 is used as a down-counter to which an initial value can be set. While the count value of the counter A21 is being positive, the counter A21 replacing the enable register 27 performs control to enable the counter B22 to perform a count operation. The CPU 3 may set the initial value of the counter A21 via the bus 4. Preferably, an interrupt issuing circuit 29 may be provided to issue an interrupt 98 to the CPU 3 upon detecting that the value of the counter A21 is no longer positive.

How the diagnostic circuit 2 of FIG. 7 operates will now be described in reference to FIG. 8. The upper part of FIG. 8 shows the frequency of the modulated clock 92 for a center-spread SSCG; the middle part shows the value of the spread direction identification signal 95, the value of a signal 96 indicative of detecting that the value of the counter A21 is positive, and an interrupt signal 98; the lower part shows the count values of the counters A21 and B22. Since the counter A21 counts the reference clock yet to be multiplied, the count value of the counter A21 in FIG. 8 is shown here as a value resulting from the multiplication by the multiplication count N for easy comparison with the count value of the counter B22.

At time T23, the CPU 3 writes a positive initial value to the counter A21. This drives the signal 96 High. At time T2 at which the spread direction identification signal 95 is driven High, the counter A21 is caused to start down-counting and the counter B22 is caused to start up-counting from zero. The counting operations are performed only during the period in which the spread direction identification signal 95 is High, i.e., during the up-spread period. At time T24 at which the value of the counter A21 becomes zero, the counter B22 is caused to stop the count operation. At this point, the interrupt issuing circuit 29 issues the interrupt signal 98 to the CPU 3. The CPU 3 runs an interrupt handling routine to read the value of the counter B22 and use the initial value written to the counter A21 so as to perform diagnosis.

With the above embodiment, it is possible to carry out accurate diagnosis by eliminating inaccuracies in determining the time at which data was written to the enable register and by precisely controlling the counting period (measuring period) of the modulated clock using a reference clock not subject to SSCG modulation. Because the CPU 3 is notified of the end of the measurement by use of an interrupt, the CPU 3 may perform other tasks until the interrupt is issued. However, the interrupt feature is not mandatory for the third embodiment that may alternatively be practiced without the interrupt issuing circuit 29. In this variation, the CPU 3 can detect that the counter A21 has reached zero by polling or by some other suitable means.

Fourth Embodiment

Control of the Measuring Period by Use of the Modulated Clock Side Counter

The third embodiment discussed above was shown to control the counting period (measuring period) of the reference clock using the counter A21. Alternatively, the counter B22 may be used to control the counting period (measuring period) of the reference clock.

Figure 9:
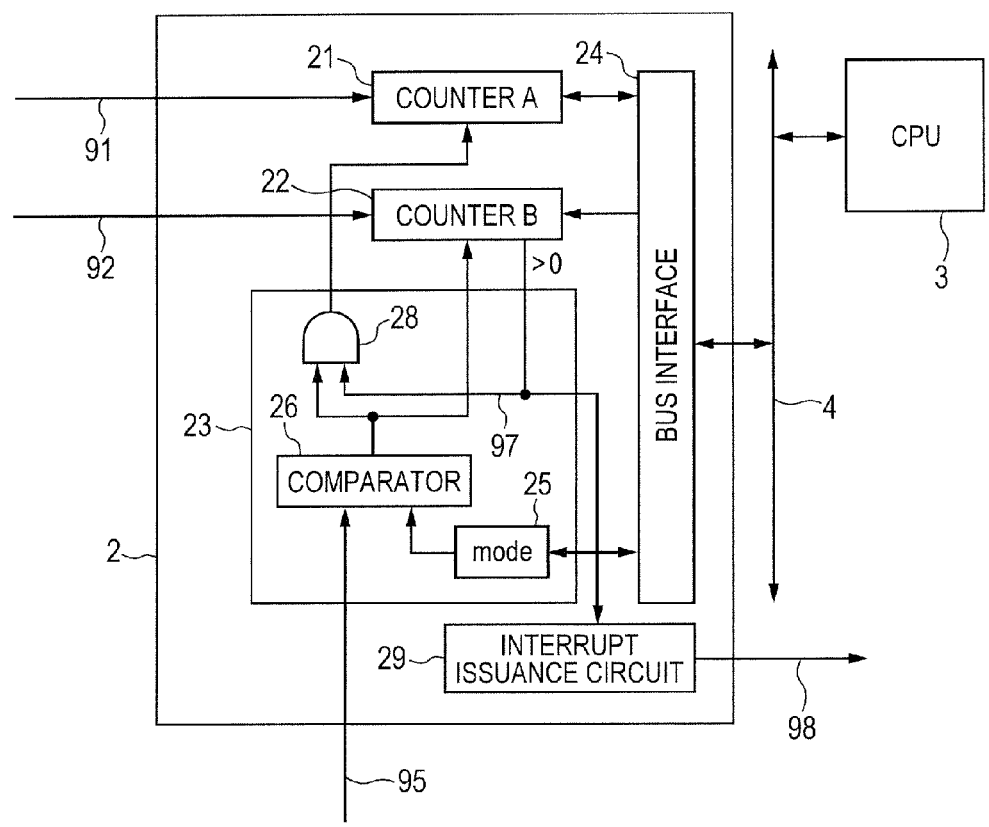
FIG. 9 is a block diagram showing another typical diagnostic circuit in a fourth embodiment of the present invention.
Figure 10:
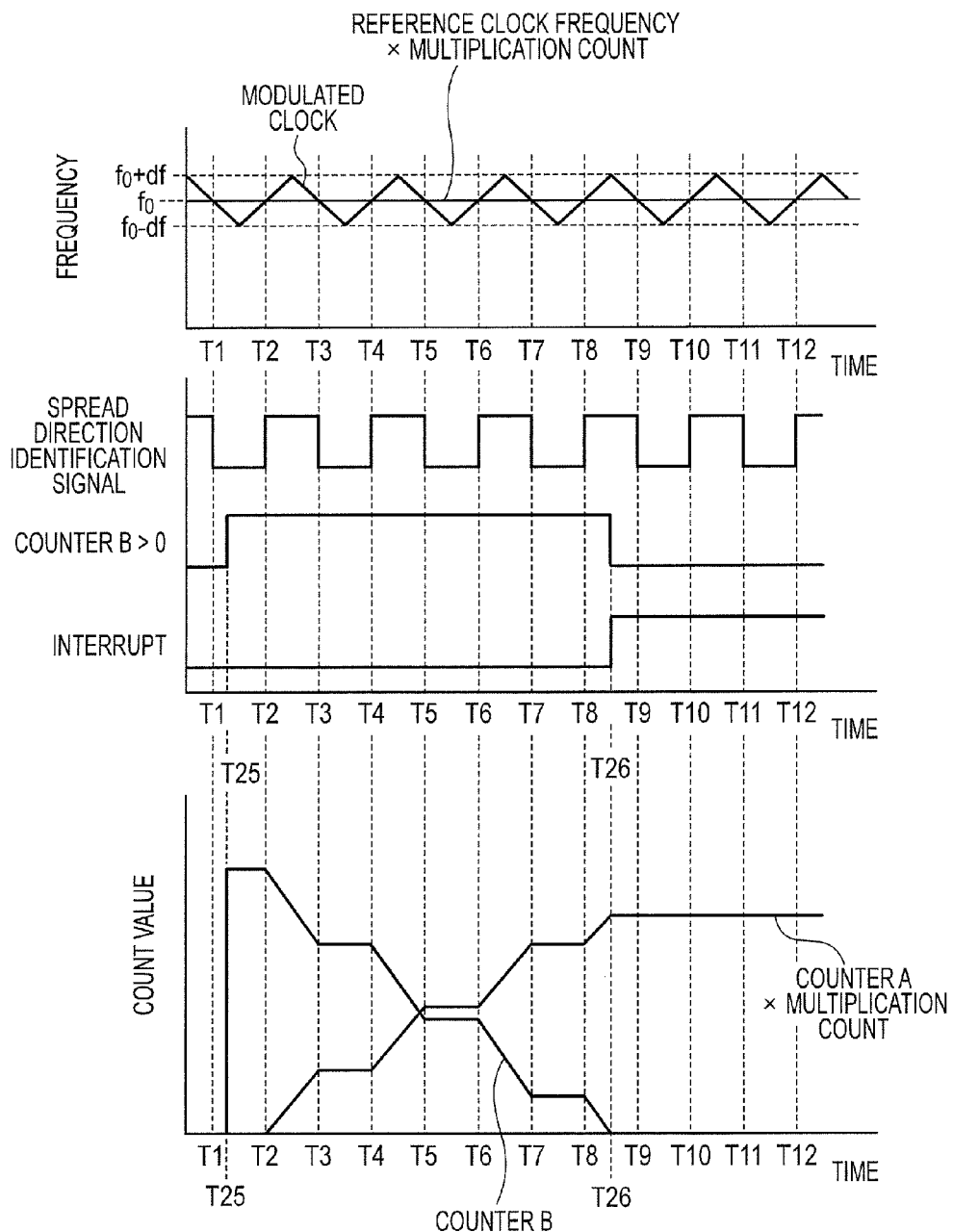
FIG. 10 is a timing chart showing typical operations of a clock generator and the diagnostic circuit in the fourth embodiment.

FIG. 9 is a block diagram showing another typical diagnostic circuit in the fourth embodiment of the present invention. FIG. 10 is a timing chart showing typical operations of the clock generator and diagnostic circuit in the fourth embodiment.

In place of the counter A21, the counter B22 may be configured with a down-counter to which an initial value may be set. Only during the period in which the count value of the counter B22 is positive, the counter A21 is enabled to perform the count operation. As another alternative, an interrupt issuing circuit 29 may be provided to issue an interrupt signal 98 to the CPU 3 upon detecting that the value of the counter B22 has returned to zero.

How the diagnostic circuit 2 of FIG. 9 operates will now be described in reference to FIG. 10. The upper part of FIG. 10 shows the frequency of the modulated clock 92 for a center-spread SSCG; the middle part shows the value of the spread direction identification signal 95, the value of a signal 97 indicative of detecting that the value of the counter B22 is positive, and the interrupt signal 98; the lower part shows the count values of the counters A21 and B22. Since the counter A21 counts the reference clock yet to be multiplied, the count value of the counter A21 in FIG. 10 is shown here as a value resulting from the multiplication by the multiplication count N for easy comparison with the count value of the counter 322.

At time T25, the CPU 3 writes a positive initial value to the counter 322. This drives the signal 97 High. At time T2 at which the spread direction identification signal 95 is driven High, the counter 322 is caused to start down-counting and the counter A21 is caused to start up-counting from zero. Only during the period in which the spread direction identification signal 95 is High, i.e., during the up-spread period, the count operations are carried out. At time T26 at which the value of the counter B22 reaches zero, the counter A21 is caused to stop its count operation. At this point, the interrupt issuing circuit 29 issues the interrupt signal 98 to the CPU 3. The CPU 3 runs an interrupt handling routine to read the value of the counter A21 and use the initial value written to the counter 322 so as to perform diagnosis.

With the above embodiment, it is possible to control the counting period (measuring period) of the reference clock using the modulated clock not subject to SSCG modulation. This makes it easier to provide synchronization with the diagnostic circuit that operates on the modulated clock.

Although the description above contains many specificities, these should not be construed as limiting the scope of the present invention made by the inventors but as merely providing illustrations of some of the presently preferred embodiments of this invention. It is evident that many alternatives, modifications and variations will become apparent to those skilled in the art in light of the foregoing description.

For example, the diagnosis of the SSCG may be not only included in the tests on the LSI before shipment but also utilized in the working diagnosis at the site of installation. The diagnosis of the SSCG may also be used for adjusting the modulation parameters through observation of the characteristics of the SSCG in question.

And although the third and the fourth embodiments above were each shown to use the down-counter to which a positive initial value may be set, this is not limitative of the present invention. Obviously, the same effect can be had by resorting to an up-counter to which a negative initial value may be set.

Thus the scope of the invention should be determined by the appended claims and their legal equivalents, rather than by the examples given.

What is claimed:

1. A semiconductor integrated circuit comprising a clock generator receiving input of a reference clock so as to generate a modulated clock based on the input reference clock, and a diagnostic circuit;
   wherein said clock generator includes:
   a phase comparator comparing the phase of said reference clock with that of a feedback clock;
   an oscillator receiving input of said modulated clock of which the oscillating frequency is controlled based on output from said phase comparator, and
   a modulation circuit receiving input of said modulated clock so as to output said feedback clock;
   wherein said modulation circuit includes a frequency divider, and a division ratio modulation circuit supplying a division ratio to said frequency divider;
   wherein said frequency divider outputs said feedback clock by dividing the output of said oscillator by said division ratio;
   wherein said division ratio modulation circuit is fed with a multiplication count and has at least one of two periods, one of the two periods being one in which said division ratio modulation circuit outputs a value larger than said modulation count as said division ratio, the other period being one in which said division ratio modulation circuit outputs a value smaller than said modulation circuit as said division ratio, said division ratio modulation circuit further outputting a magnitude relationship between said division ratio and said multiplication count in the form of a spread direction identification signal, and
   wherein said diagnostic circuit includes a first counter counting said reference clock, and a second counter counting said modulated clock based on said spread direction identification signal.

2. A semiconductor integrated circuit according to claim 1, further comprising a CPU and a bus;
   wherein said diagnostic circuit includes a modulation mode designation register and a bus interface circuit;
   wherein said bus interface circuit couples said first counter, said second counter, and said modulation mode designation register to said bus in a manner accessible from said CPU;
   wherein said CPU causes said second counter to perform a count operation if said spread direction identification signal identifies the direction of spread designated by said modulation mode designation register, and
   wherein said CPU diagnoses operating status of said clock generator based on at least one of the values of said first and said second counters.

3. A semiconductor integrated circuit according to claim 2, wherein said diagnostic circuit includes an enable register;
   wherein said enable register is coupled to said bus interface circuit in a manner writable by said CPU via said bus, and
   wherein, during a period in which said enable register holds a value for inhibiting said first and said second counters from counting, said first and said second counters stop performing count operations.

4. A semiconductor integrated circuit according to claim 2, wherein said first counter is a down-counter to which an initial value may be written by said CPU via said bus, and
   wherein said second counter performs a count operation during a period in which said first counter has a positive value.

5. A semiconductor integrated circuit according to claim 2, wherein said second counter is a down-counter to which an initial value may be written by said CPU via said bus, and
   wherein said first counter performs a count operation during a period in which said second counter has a positive value.

6. A semiconductor integrated circuit according to claim 4, wherein said diagnostic circuit generates an interrupt to said CPU when the value of said first counter becomes zero.

7. A semiconductor integrated circuit according to claim 2, wherein said CPU diagnoses whether said clock generator is defective by reading at least one of the values of said first and said second counters and by comparing what is read with a predetermined range of values.

8. A semiconductor integrated circuit according to claim 1, wherein, further fed with a modulation degree, said division ratio modulation circuit increases gradually said division ratio up to a maximum division ratio calculated on the basis of said multiplication count and said modulation degree, and decreases gradually said division ratio down to a minimum division ratio calculated on the basis of said multiplication count and said modulation degree.

9. A semiconductor integrated circuit comprising a clock generator receiving input of a reference clock so as to generate a modulated clock based on the input reference clock, and a diagnostic circuit;
wherein said clock generator includes;
a phase comparator comparing the phase of said reference clock with that of a feedback clock;
an oscillator outputting said modulated clock of which the oscillating frequency is controlled based on output from said phase comparator, and
a modulation circuit receiving input of said modulated clock so as to output said feedback clock;
wherein said modulation circuit includes a frequency divider, and a division ratio modulation circuit supplying a division ratio to said frequency divider;
wherein said frequency divider outputs said feedback clock by dividing the output of said oscillator by said division ratio;
wherein said division ratio modulation circuit outputs a spread status signal indicative of modulation status, and
wherein said diagnostic circuit includes a counter counting said modulated clock based on said spread status signal.

10. A semiconductor integrated circuit according to claim 9, wherein said division ratio modulation circuit is fed with a multiplication count and has at least one of two periods, one of the two periods being one in which said division ratio modulation circuit outputs a value larger than said modulation count as said division ratio, the other period being one in which said division ratio modulation circuit outputs a value smaller than said modulation circuit as said division ratio, said division ratio modulation circuit further outputting a magnitude relationship between said division ratio and said multiplication count in the form of said spread status signal, and
wherein said diagnostic circuit causes said counter to count said modulated clock in one of two cases, one of the two cases being one in which said division ratio is larger than said multiplication count, the other case being one in which said division ratio is smaller than said multiplication count.

11. A semiconductor integrated circuit according to claim 10, wherein, further fed with a modulation degree, said division ratio modulation circuit increases gradually said division ratio up to a maximum division ratio calculated on the basis of said multiplication count and said modulation degree, and decreases gradually said division ratio down to a minimum division ratio calculated on the basis of said multiplication count and said modulation degree.

12. A semiconductor integrated circuit according to claim 9, wherein said counter is regarded as a second counter;
wherein said diagnostic circuit further includes a first counter counting said reference clock, and
wherein, after causing said first and said second counters to perform count operations over the same period, said diagnostic circuit diagnoses whether said clock generator is defective based on the values of said first and said second counters.

13. A semiconductor integrated circuit according to claim 9, wherein said counter is regarded as a second counter;
wherein said diagnostic circuit further includes a first counter to which a first positive initial value is designated and which down-counts in accordance with said reference clock, and
wherein said diagnostic circuit causes said second counter to perform a count operation during a period in which the count value of said first counter is positive, before diagnosing whether said clock generator is defective based on the count value of said second counter.

14. A semiconductor integrated circuit according to claim 9, wherein said counter is regarded as a second counter;
wherein said diagnostic circuit further includes a first counter counting said reference clock;
wherein said second counter to which a second positive initial value is designated and which down-counts in accordance with said modulated clock, and
wherein said diagnostic circuit causes said first counter to perform a count operation during a period in which the count value of said second counter is positive, before diagnosing whether said clock generator is defective based on the count value of said first counter.

* * * * *